(12) United States Patent
Jonishi

(10) Patent No.: US 9,548,299 B2
(45) Date of Patent: Jan. 17, 2017

(54) SEMICONDUCTOR DEVICE

(71) Applicant: FUJI ELECTRIC CO., LTD., Kawasaki-shi (JP)

(72) Inventor: Akihiro Jonishi, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/848,736

(22) Filed: Sep. 9, 2015

(65) Prior Publication Data

US 2015/0380400 A1      Dec. 31, 2015

Related U.S. Application Data

(63) Continuation of application No. PCT/JP2014/065391, filed on Jun. 10, 2014.

(30) Foreign Application Priority Data

Jul. 5, 2013    (JP) .................................. 2013-142147

(51) Int. Cl.
*H01L 29/10* (2006.01)
*H01L 27/06* (2006.01)
(Continued)

(52) U.S. Cl.
CPC ... *H01L 27/0629* (2013.01); *H01L 21/823878* (2013.01); *H01L 21/823892* (2013.01);
(Continued)

(58) Field of Classification Search
CPC ............... H01L 21/823878; H01L 21/823892; H01L 27/0928; H01L 27/0646; H01L 29/1095; H01L 29/402; H01L 29/861; H01L 29/866; H01L 27/092; H01L 27/0629
(Continued)

(56) References Cited

U.S. PATENT DOCUMENTS 5,262,345 A * 11/1993 Nasser ................... H01L 21/74
148/DIG. 9
5,525,824 A * 6/1996 Himi ................... H01L 27/1203
257/370
(Continued)

FOREIGN PATENT DOCUMENTS

JP      S63-202966 A      8/1988
JP      H06-163823 A      6/1994
(Continued)

OTHER PUBLICATIONS

T. Yamazaki et al, "New High Voltage Integrated Circuits Using Self-Shielding Technique", Proceedings of the 11th International Symposium on Power Semiconductor Devices and ICs, 1999 (ISPSD '99), Toronto, May 1999, pp. 333 to 336.

*Primary Examiner* — Jarrett Stark
*Assistant Examiner* — Shahed Ahmed
(74) *Attorney, Agent, or Firm* — Rabin & Berdo, P.C.

(57) ABSTRACT

A semiconductor device provides reduced size and increased performance, and includes a semiconductor layer having a surface layer including first and second semiconductor regions connected to first and second potentials, respectively; a third semiconductor region provided inside the first semiconductor region and connected to a third potential; a fourth semiconductor region provided inside the second semiconductor region and connected to the third potential; a plurality of a first element provided in each of the first, second, third, and fourth semiconductor regions; a first isolation region provided between and in contact with the first and second semiconductor regions, electrically connected to the semiconductor layer, and connected to a fourth potential; and a second isolation region which encloses the periphery of and maintains a withstand voltage of the first and second semiconductor regions. The third and fourth
(Continued)

potentials are lower than the second potential, which is lower than the first potential.

20 Claims, 8 Drawing Sheets

(51) Int. Cl.
    *H01L 21/8238*   (2006.01)
    *H01L 27/092*   (2006.01)
    *H01L 29/06*   (2006.01)
    *H01L 29/40*   (2006.01)
    *H01L 29/861*   (2006.01)
    *H01L 29/866*   (2006.01)

(52) U.S. Cl.
    CPC ...... *H01L 27/0928* (2013.01); *H01L 29/0646* (2013.01); *H01L 29/1095* (2013.01); *H01L 29/402* (2013.01); *H01L 29/861* (2013.01); *H01L 29/866* (2013.01); *H01L 27/092* (2013.01)

(58) Field of Classification Search
    USPC ....... 257/183, 335, 314, 372, 501, 506, 572; 438/199, 208, 220, 224, 235, 294
    See application file for complete search history.

(56) References Cited

U.S. PATENT DOCUMENTS

| | | |
|---|---|---|
| 5,801,418 A | 9/1998 | Ranjan |
| 5,847,432 A | 12/1998 | Nozaki |
| 5,994,741 A | 11/1999 | Koizumi et al. |
| 2006/0113571 A1 | 6/2006 | Liu et al. |
| 2006/0118882 A1 | 6/2006 | Kitahara |
| 2006/0249751 A1* | 11/2006 | de Fresart ........... H01L 29/0847 257/197 |
| 2010/0109090 A1* | 5/2010 | Zitouni ............... H01L 27/0921 257/372 |
| 2011/0199346 A1 | 8/2011 | Ko et al. |
| 2013/0270606 A1* | 10/2013 | Chen ................... H01L 29/7835 257/183 |
| 2013/0279051 A1* | 10/2013 | Gill ........................ H02H 9/041 361/56 |

FOREIGN PATENT DOCUMENTS

| | | |
|---|---|---|
| JP | H08/191107 A | 7/1996 |
| JP | 3214818 B2 | 10/2001 |
| JP | 2003-152095 A | 5/2003 |
| JP | 2005-116586 A | 4/2005 |
| JP | 2006-156963 A | 6/2006 |
| JP | 2006-165056 A | 6/2006 |
| JP | 2011-166153 A | 8/2011 |

* cited by examiner

SEMICONDUCTOR DEVICE

CROSS-REFERENCE TO RELATED APPLICATIONS

This non-provisional application for a U.S. Patent is a Continuation of International Application PCT/JP2014/065391 filed Jun. 10, 2014, which claims priority from JP PA 2013-142147 filed Jul. 5, 2013, the entire contents of both of which are hereby incorporated by reference.

BACKGROUND OF THE INVENTION

1. Field of the Invention

The present invention relates to a semiconductor device.

2. Background of the Related Art

To date, transformers and photocouplers, whose input side and output side are electrically isolated, have been in the public domain as semiconductor elements used in the gate drive of a switching element such as an IGBT (insulated gate bipolar transistor) that configures a power converting bridge circuit in an industrial inverter. Also, high voltage ICs (HVIC), whose input side and output side are not electrically isolated, are being used in recent years, mainly in low power inverter applications, in order to reduce cost (for example, refer to T. Yamazaki and 6 others, "New High Voltage Integrated Circuits Using Self-Shielding Technique", Proceedings of the 11$^{th}$ International Symposium on Power Semiconductor Devices and ICs, 1999 (ISPSD '99), Toronto, May, 1999, Pages 333 to 336. (Non-patent Literature 1) and Japanese Patent No. 3,214,818 (Patent Literature 1).

For example, a high voltage IC wherein a low cost bulk substrate can be used, and which is fabricated by an IC process using self-isolation technology that does not require a special element isolation process, is disclosed in Non-Patent Literature 1. A description will be given of the structure of a high voltage IC fabricated using a self-isolation IC process. FIG. 6 is a plan view schematically showing the planar structure of an existing high voltage IC. FIG. 7 is a sectional view showing the sectional structure along a cutting line AA-AA' of FIG. 6. FIG. 8 is a circuit diagram showing an equivalent circuit of the high voltage IC of FIG. 7.

As shown in FIGS. 6 and 7, a high voltage IC 200 generally includes a high side drive circuit 210, a level shifter 214, and a control circuit 215. The high side drive circuit 210 includes a gate drive circuit, a level shift resistor, and the like. The high side drive circuit 210 is disposed in a high side drive circuit region 220. The periphery of the high side drive circuit region 220 is enclosed by a high withstand voltage isolation region 224. The high side drive circuit region 220 is electrically isolated by the high withstand voltage isolation region 224 from a low side region 225 in which a low side drive circuit (not shown) is disposed. The level shifter 214 is disposed in the high withstand voltage isolation region 224.

The periphery of the high withstand voltage isolation region 224 is enclosed by the low side region 225. The control circuit 215, which controls the high side drive circuit 210, is disposed in the low side region 225. The low side region 225 is a portion excluding the high side drive circuit region 220 and high withstand voltage isolation region 224. A gate drive circuit 211 configuring the high side drive circuit 210 is formed of a CMOS (complementary MOS) circuit wherein a high side p-channel MOSFET (insulated gate field-effect transistor, hereafter referred to as a PMOS) 212 and low side n-channel MOSFET (hereafter referred to as an NMOS) 213 are connected so as to complement each other.

A high voltage IC formed using a self-isolation IC process is such that the lateral PMOS 212 of the high side drive circuit 210 is formed in an n$^-$-type diffusion region 202 selectively provided in a surface layer of a p-type bulk substrate 201. A p$^-$-type diffusion region 203 is provided to a comparatively small depth inside the n$^-$-type diffusion region 202, and the lateral NMOS 213 is formed in the p$^-$-type diffusion region 203. The n$^-$-type diffusion region 202 is connected to a VB terminal, which has the highest potential of the high side drive circuit 210. The p$^-$-type diffusion region 203 is connected to a VS terminal, which has the lowest potential of the high side drive circuit 210. The difference in potential between the VB terminal and VS terminal is in the region of, for example, 9V to 24V, which is the power supply voltage of the high side drive circuit 210.

A p$^-$-type region 204 is provided in the low side region 225 on the outside of the n$^-$-type diffusion region 202 in a surface layer of the p-type bulk substrate 201. The p-type bulk substrate 201 and p$^-$-type region 204 are connected to a GND terminal of ground potential (for example, 0V). An n$^-$-type low concentration diffusion region 205 configuring the high withstand voltage isolation region 224 is provided between the n$^-$-type diffusion region 202 and p$^-$-type region 204. When the potential of the high side drive circuit region 220 rises to a high voltage 600V or more higher than that of the low side region 225, the n$^-$-type low concentration diffusion region 205 is depleted owing to the p-n junction between the n$^-$-type low concentration diffusion region 205 and p$^-$-type region 204 being reverse biased, and the lateral direction (the direction parallel to the substrate main surface) withstand voltage is maintained.

As shown in FIG. 8, the high voltage IC 200 is connected to, for example, a power converting bridge circuit, and drives first and second MOSFETs 101 and 102 configuring one phase of the power converting bridge circuit. The first and second MOSFETs 101 and 102 are connected in series between a high voltage main power supply (positive electrode side) Vdc and the ground potential GND, which is the negative electrode side of the main power supply. The VS terminal is connected to a connection point 105 of the first MOSFET 101 and second MOSFET 102. The connection point 105 is an output point of the bridge circuit configured of the first and second MOSFETs 101 and 102. Reference signs 103 and 104 are FWDs (free wheeling diodes).

A description will be given of operations of the high voltage IC 200, taking as an example a case of driving the first MOSFET 101 on the high side of the power converting bridge circuit. The high side drive circuit 210, taking the potential of the connection point 105 to which the VS terminal is connected as a reference potential VS, operates at a potential between the reference potential VS and the power supply potential VB, which is the highest potential of the high side drive circuit 210. The control circuit 215, operating with the ground potential GND as a reference, generates a low side level on/off signal for turning the first MOSFET 101 on and off. The low side level on/off signal is converted into a high side level on/off signal by the level shifter 214, and transmitted to the high side drive circuit 210. The on/off signal input into the high side drive circuit 210 is input into the gate of the first MOSFET 101 via a NOT circuit and the subsequent gate drive circuit 211. The first MOSFET 101 is turned on and off in accordance with the on/off signal.

The first MOSFET 101 is turned on and off in accordance with the on/off signal from the control circuit 215 transmitted via the level shifter 214 in this way. The potential of the VS terminal fluctuates between 0V (GND) and several hundred volts (Vdc) while the high voltage IC 200 is operating. Signal transmission by the level shifter 214 is carried out by current being caused to flow into a level shift resistor 217 connected between the drain of the level shifter 214 and the VB terminal, and voltage drop in the level shift resistor 217 being detected. Therefore, the drain of the level shifter 214 and the component of the power supply potential VB of the high side drive circuit 210 have to be electrically isolated. A high voltage IC having a structure wherein the high withstand voltage isolation region and level shifter are integrated, and configured so that the drain of the level shifter 214 and the component of the power supply potential VB of the high side drive circuit 210 are electrically isolated, is disclosed in Patent Literature 1.

However, although a drive circuit in an integrated circuit is generally configured by combining a low breakdown voltage MOSFET with a guaranteed breakdown voltage in the region of 5V and an intermediate breakdown voltage MOSFET with a guaranteed breakdown voltage in the region of 24V, it is difficult to use a low breakdown voltage MOSFET for the high side drive circuit 210 in the existing high voltage IC 200. The reason for this is as follows. Voltage in the region of 9V to 24V (the power supply voltage VB of the high side drive circuit 210), which exceeds the guaranteed breakdown voltage of a low breakdown voltage MOSFET, is applied to the high side drive circuit region 220 in which the high side drive circuit 210 is formed. Therefore, in order to use a low breakdown voltage MOSFET for the high side drive circuit 210, a special circuit configuration is needed so that voltage exceeding the guaranteed breakdown voltage is not applied to the low breakdown voltage MOSFET.

As this kind of problem occurs, it is generally the case in existing high voltage ICs that the high side drive circuit is configured of only intermediate breakdown voltage MOSFETs, without using a low breakdown voltage MOSFET, even when a circuit portion that can be configured of a low breakdown voltage MOSFET exists. There is no description of a method whereby a low breakdown voltage MOSFET is used for the high side drive circuit in Non-Patent Literature 1 or Patent Literature 1 either. However, the higher the breakdown voltage of a MOSFET, the greater the drain-to-source distance of a MOSFET configuring the high side drive circuit, because of which the on-state resistance per unit area increases. Therefore, problems occur in that the current that can be caused to flow by the device decreases, operation becomes slower, the device size increases in order to increase the current, and the like. Therefore, a gate drive circuit configured of only intermediate breakdown voltage MOSFETs is inferior in terms of performance and size to a gate drive circuit configured of a low breakdown voltage MOSFET and an intermediate breakdown voltage MOSFET.

The invention, in order to resolve the problems of the heretofore described existing technology, has an object of providing a semiconductor device such that a reduction in size and an increase in performance can be realized.

SUMMARY OF THE INVENTION

In order to resolve the heretofore described problems, thereby achieving the object of the invention, a semiconductor device according to the invention has the following characteristics. A second conductivity type first semiconductor region connected to a first potential is selectively provided in a surface layer of a first conductivity type semiconductor layer. A second conductivity type second semiconductor region connected to a second potential lower than the first potential is selectively provided in a surface layer of the semiconductor layer. A first conductivity type third semiconductor region connected to a third potential lower than the second potential is selectively provided inside the first semiconductor region. A first conductivity type fourth semiconductor region connected to the third potential is selectively provided inside the second semiconductor region. A plurality of a first element operating with the third potential as a reference potential are provided in each of the first semiconductor region, second semiconductor region, third semiconductor region, and fourth semiconductor region. A first conductivity type first isolation region is provided between the first semiconductor region and second semiconductor region and in contact with the first semiconductor region and second semiconductor region. The first conductivity type first isolation region is electrically connected to the semiconductor layer, which is connected to a fourth potential lower than the first potential and second potential.

Also, the semiconductor device according to the heretofore described aspect of the invention is characterized in that the first isolation region is provided at least between a portion in which the first elements of the first semiconductor region and third semiconductor region are provided and a portion in which the first elements of the second semiconductor region and fourth semiconductor region are provided.

Also, the semiconductor device according to the heretofore described aspect of the invention is characterized in that the first isolation region is provided so as to enclose the periphery of the second semiconductor region.

Also, the semiconductor device according to the heretofore described aspect of the invention is characterized in that the first semiconductor region includes a first region in which the first element is formed and a second region, provided between the first region and the first isolation region, of an impurity concentration lower than that of the first region.

Also, the semiconductor device according to the heretofore described aspect of the invention is characterized by further including a second conductivity type second isolation region enclosing the periphery of the first semiconductor region and second semiconductor region, maintaining the withstand voltage of the first semiconductor region and second semiconductor region, and having an impurity concentration lower than that of the first semiconductor region and second semiconductor region, and a second element provided in the second isolation region. Further, the first isolation region is characterized by being provided at least between the first semiconductor region and a portion in which the second element of the second isolation region is provided.

Also, the semiconductor device according to the heretofore described aspect of the invention is characterized in that the first elements provided in the second semiconductor region and fourth semiconductor region have a breakdown voltage lower than the difference between the first potential and third potential.

Also, the semiconductor device according to the heretofore described aspect of the invention is characterized by further including a conductive body provided across an oxide film on the surface of the first isolation region and connected to the third potential.

Also, the semiconductor device according to the heretofore described aspect of the invention further includes a two-terminal third element of which one terminal is connected to the second semiconductor region and the other terminal is connected to the fourth semiconductor region. Further, the withstand voltage between the terminals of the third element is characterized by being greater than the difference between the second potential and third potential and smaller than the difference between the first potential and third potential.

Also, the semiconductor device according to the heretofore described aspect of the invention is characterized in that a gate drive circuit that drives an external transistor is configured of a plurality of the first element.

Also, the semiconductor device according to the heretofore described aspect of the invention is characterized in that the external transistor is connected between a positive electrode side and negative electrode side of a power supply, the potential of a low potential side terminal of the transistor is the third potential, and the third potential fluctuates between the positive electrode side and negative electrode side of the power supply.

Also, the semiconductor device according to the heretofore described aspect of the invention is characterized in that depletion layers spread from the p-n junction between the first isolation region and the first semiconductor region and second semiconductor region when the third potential is higher than the fourth potential.

According to the invention, by a first isolation region of a fourth potential (substrate potential) being provided between a first semiconductor region of a first potential and a second semiconductor region of a second potential lower than the first potential, the first semiconductor region and second semiconductor region can be electrically isolated when a high voltage IC is in an on-state. Therefore, an intermediate breakdown voltage element having a guaranteed breakdown voltage equal to or higher than the first potential can be disposed in the first semiconductor region, and a low breakdown voltage element with an on-state resistance lower than that of the intermediate breakdown voltage element can be disposed in the second semiconductor region. Therefore, electrical characteristics can be improved in comparison with an existing high side drive circuit configured of only intermediate breakdown voltage elements. Also, according to the invention, by the high side drive circuit being configured of an intermediate breakdown voltage element and a low breakdown voltage element, the chip area can be reduced in comparison with an existing high side drive circuit configured of only intermediate breakdown voltage elements.

Advantageous Effects of Invention

According to the semiconductor device according to the invention, advantages are achieved in that a reduction in size and an increase in performance can be realized.

DETAILED DESCRIPTION OF THE INVENTION

Hereafter, referring to the attached drawings, a detailed description will be given of preferred embodiments of a semiconductor device according to the invention. A layer or region being prefixed by n or p in the specification and attached drawings means that electrons or holes respectively are majority carriers. Also, + or − attached to n or p means a higher impurity concentration or lower impurity concentration respectively than in a layer or region to which n or p is not attached. In the following description of the embodiments and in the attached drawings, the same reference signs are given to the same configurations, and redundant descriptions are omitted.

Embodiment 1

Figure 1:
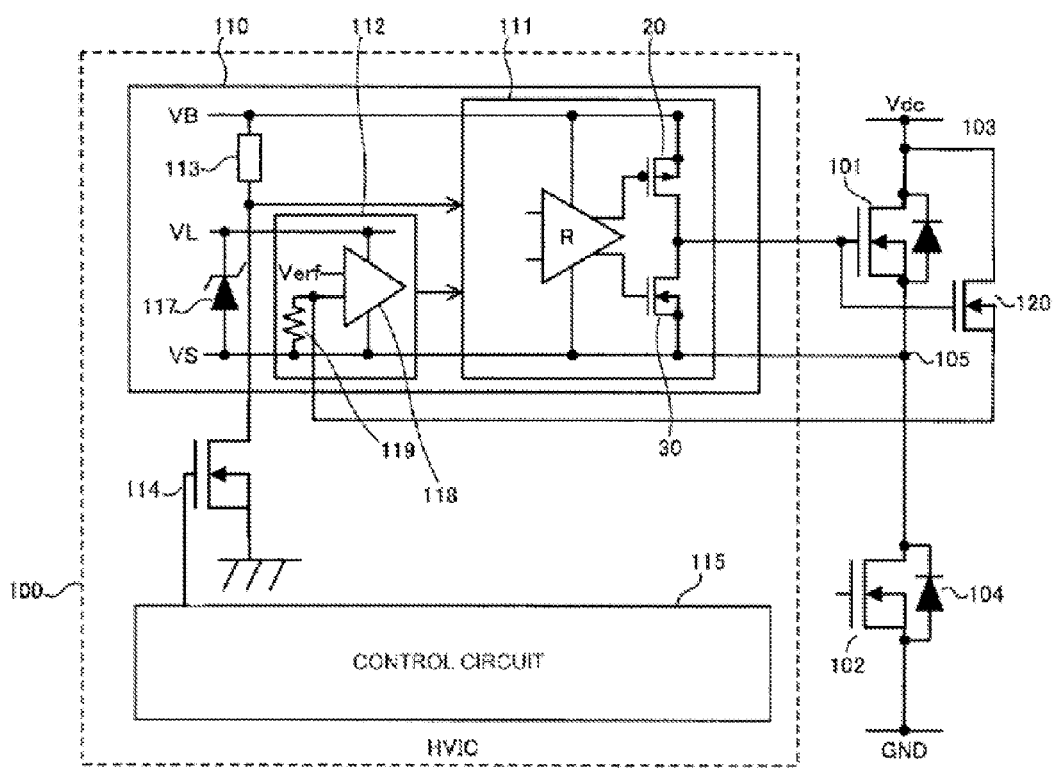
FIG. 1 is a circuit diagram showing an equivalent circuit of a high voltage IC according to Embodiment 1.

A description will be given of the structure of a semiconductor device according to Embodiment 1, taking as an example a high voltage IC that drives a power converting bridge circuit. FIG. 1 is a circuit diagram showing an equivalent circuit of the high voltage IC according to Embodiment 1. As shown in FIG. 1, first and second MOSFETs 101 and 102 configuring a power converting bridge circuit (main circuit) are connected in series between a high voltage main power supply (positive electrode side) Vdc and a ground potential GND, which is the negative electrode side of the main power supply. A VS terminal is connected to a connection point 105 of the first MOSFET 101 and second MOSFET 102. The connection point 105 is an output point of the power converting bridge circuit, and is connected to a motor or the like, which is a load. Reference signs 103 and 104 are FWDs (free wheeling diodes).

A high voltage IC 100 includes a high side drive circuit 110, a level shifter (second element) 114, and a control circuit 115, and drives the high side first MOSFET 101 of the first and second MOSFETs 101 and 102 configuring one phase of the power converting bridge circuit. Taking, for example, 9V to 24V as a power supply voltage VBS and the potential of a VS terminal as a reference potential (third potential) VS, the high side drive circuit 110 operates at a potential between the reference potential VS and a power supply potential (first potential) VB, which is higher than the reference potential VS by the power supply voltage VBS (VBS=VB−VS). Specifically, the high side drive circuit 110 includes, for example, an intermediate voltage circuit unit 111, a low voltage circuit unit 112, a level shift resistor 113, and the like.

The intermediate voltage circuit unit 111 is configured of a multiple of elements (first elements) having a guaranteed breakdown voltage (in the region of, for example, 24V, hereafter referred to as an intermediate breakdown voltage)

equal to or higher than the power supply voltage VBS of the high side drive circuit 110, and operates with VBS as a power supply voltage. Specifically, the intermediate voltage circuit unit 111 is formed of, for example, a gate drive circuit, and includes a CMOS circuit wherein a high side p-channel MOSFET (PMOS) 20 and low side n-channel MOSFET (NMOS) 30 are connected so as to complement each other. The source of the PMOS 20 is connected to the VB terminal, and the drain of the PMOS 20 is connected to the drain of the NMOS 30. The source of the NMOS 30 is connected to the VS terminal. A connection point of the PMOS 20 and NMOS 30 is connected to the gate of the first MOSFET 101.

The low voltage circuit unit 112 is configured of a multiple of elements (first elements) having a guaranteed breakdown voltage (for example, 10V or less, hereafter referred to as a low breakdown voltage) lower than the power supply voltage VBS of the high side drive circuit 110 and higher than a potential difference VLS between a VL terminal and the VS terminal, and operates with the potential difference VLS as a power supply voltage (for example, 5V or less). Specifically, the low voltage circuit unit 112 is an overcurrent detector circuit configured of, for example, a comparator 118 and shunt resistor 119. A current detecting current sensing MOSFET 120 is connected between the low voltage circuit unit 112 and the first MOSFET 101. The potential of the VB terminal is the power supply potential VB (the highest potential of the intermediate voltage circuit unit 111), which is the highest potential of the high side drive circuit 110. The potential of the VL terminal (a second potential) is the highest potential of the low voltage circuit unit 112. The potential of the VS terminal is the reference potential VS (the reference potential of the intermediate voltage circuit unit 111 and low voltage circuit unit 112), which is the lowest potential of the high side drive circuit 110.

The control circuit 115 controls the high side drive circuit 110. Specifically, the control circuit 115, operating with the ground potential GND as a reference, generates a low side level on/off signal for turning the first MOSFET 101 on and off and a low side level on/off signal for turning the second MOSFET 102 on and off. The level shifter 114 is configured of, for example, a MOSFET, and converts a low side level on/off signal generated by the control circuit 115 into a high side level on/off signal to be input into the gate of the first MOSFET 101. The level shift resistor 113 is connected between the VB terminal and level shifter 114. A Zener diode (third element) 117 with a breakdown voltage in the region of, for example, 5.5V, which is greater than the potential difference VLS between the VL terminal and VS terminal and smaller than the potential difference VBS between the VB terminal and VS terminal, is connected between the VL terminal and VS terminal. Although omitted from the drawing, the Zener diode 117 is a component of, for example, the intermediate voltage circuit unit 111.

Figure 2:
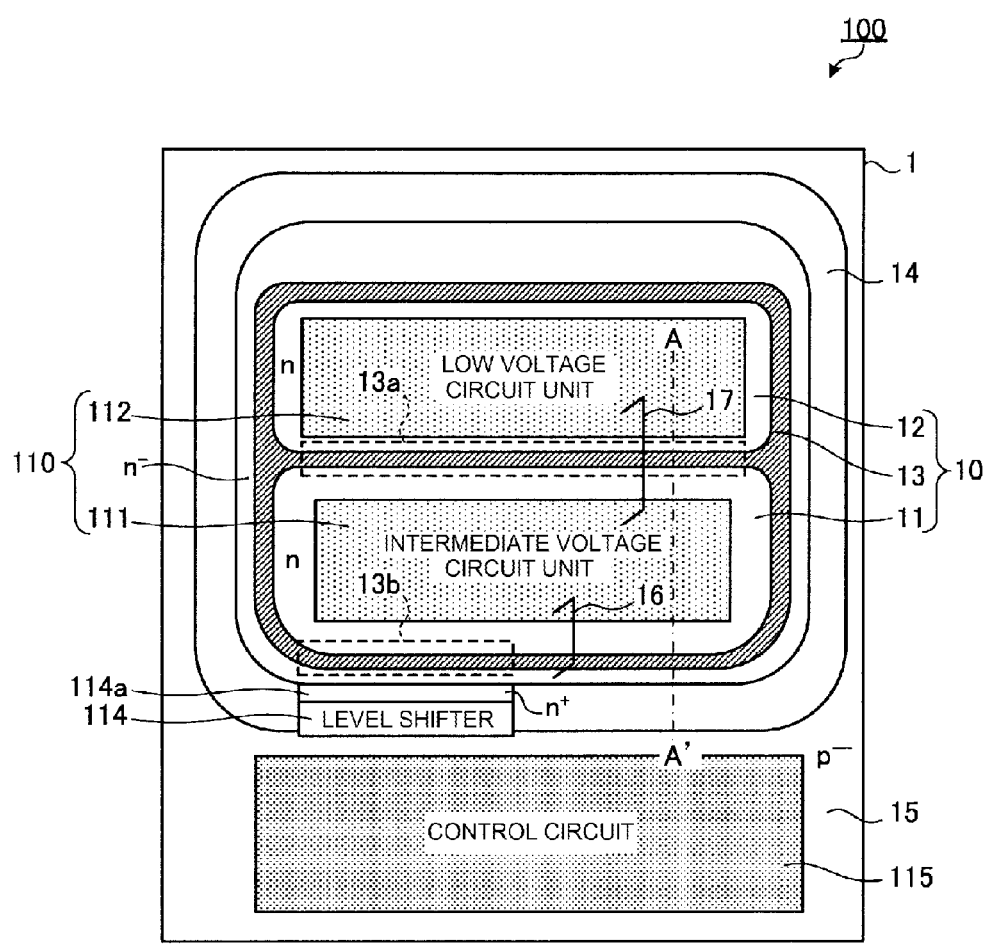
FIG. 2 is a plan view schematically showing the planar structure of the high voltage IC according to Embodiment 1.

Next, a description will be given of the planar structure of the high voltage IC 100 according to Embodiment 1. FIG. 2 is a plan view schematically showing the planar structure of the high voltage IC according to Embodiment 1. As shown in FIG. 2, a high side drive circuit region 10, a high withstand voltage isolation region 14, and a low side region 15 are provided on a p⁻⁻-type substrate 1. The high side drive circuit 110 is disposed in the high side drive circuit region 10. Specifically, an intermediate voltage circuit region 11 and a low voltage circuit region 12 are provided in the high side drive circuit region 10. The intermediate voltage circuit unit 111 is disposed in the intermediate voltage circuit region 11, and the low voltage circuit unit 112 is disposed in the low voltage circuit region 12. The power supply voltage of the intermediate voltage circuit unit 111 is supplied from the exterior via wiring 16. Also, a voltage that is the power supply voltage of the intermediate voltage circuit region 11 clamped to the power supply voltage of the low voltage circuit unit 112 is supplied to the low voltage circuit unit 112 via wiring 17 and a buffer (not shown).

The intermediate voltage circuit region 11 and low voltage circuit region 12 are electrically isolated by a potential isolation region 13. Specifically, the potential isolation region 13 is disposed in, for example, a lattice form enclosing, for example, the periphery of the intermediate voltage circuit region 11 and enclosing the periphery of the low voltage circuit region 12. The intermediate voltage circuit region 11 and low voltage circuit region 12 are electrically isolated by the potential isolation region 13 disposed between the intermediate voltage circuit region 11 and low voltage circuit region 12. Also, the intermediate voltage circuit region 11 and a drain 114a of the level shifter 114 disposed in the high withstand voltage isolation region 14 are electrically isolated by the potential isolation region 13 disposed between the intermediate voltage circuit region 11 and high withstand voltage isolation region 14.

By the intermediate voltage circuit region 11 and low voltage circuit region 12 being isolated by the potential isolation region 13, the potential applied to the low voltage circuit region 12 can be set lower than the potential applied to the intermediate voltage circuit region 11. Therefore, it is possible to prevent a voltage exceeding the guaranteed breakdown voltage from being applied to the low voltage circuit unit 112 disposed in the high side drive circuit region 10. Also, by the intermediate voltage circuit region 11 and level shifter 114 being isolated by the potential isolation region 13, leakage current of the intermediate voltage circuit region 11 can be prevented from flowing into the drain 114a of the level shifter 114.

As it is sufficient that the potential isolation region 13 is disposed to an extent such that the intermediate voltage circuit unit 111 and low voltage circuit unit 112 can be electrically isolated, and the high side drive circuit 110 and level shifter 114 can be electrically isolated, the disposition position thereof can be variously changed. For example, when the resistance between the intermediate voltage circuit region 11 (a first n-type diffusion region, to be described hereafter) and the low voltage circuit region 12 (a second n-type diffusion region, to be described hereafter) is sufficiently high, and the leakage current between the intermediate voltage circuit region 11 and low voltage circuit region 12 is small enough not to adversely affect element characteristics, the ring-form potential isolation region 13 enclosing the periphery of the low voltage circuit region 12 may be of a planar pattern such that one portion of the ring form is opened. In this case, it is preferable that the potential isolation region 13 enclosing the periphery of the low voltage circuit region 12 is at least disposed between the portion of the intermediate voltage circuit region 11 in which the intermediate voltage circuit unit 111 is disposed and the portion of the low voltage circuit region 12 in which the low voltage circuit unit 112 is disposed (a portion indicated by reference sign 13a). Also, for example, when the isolation resistance between the intermediate voltage circuit region 11 (the first n-type diffusion region, to be described hereafter) and the high withstand voltage isolation region 14 is sufficiently high (for example, 10 kΩ or more), and the leakage current between the intermediate voltage circuit region 11 and level shifter 114 is small enough not to adversely affect element characteristics, the ring-form potential isolation region 13 enclosing the periphery of the intermediate voltage circuit region 11 may be of a planar pattern such that one portion of the ring form is opened. In this case, it is preferable that the potential isolation region 13 enclosing the periphery of the intermediate voltage circuit region 11 is at least disposed between the portion of the high side drive circuit region 10 in which the high side drive circuit 110 is disposed and the portion of the high withstand voltage isolation region 14 in which the level shifter 114 is disposed (a portion indicated by reference sign 13b).

The periphery of the high side drive circuit region 10 is enclosed by the high withstand voltage isolation region 14. That is, the high withstand voltage isolation region 14 encloses the periphery of the high side drive circuit region 10 further to the outer side than the potential isolation region 13 enclosing the periphery of the high side drive circuit region 10. The high side drive circuit region 10 is electrically isolated from the low side region 15 by the high withstand voltage isolation region 14, and is of a configuration such that a high voltage 600V or more higher than that of the low side region 15 can be applied. The periphery of the high withstand voltage isolation region 14 is enclosed by the low side region 15. The control circuit 115 and a low side drive circuit (not shown) are disposed in the low side region 15. The low side region 15 is a portion excluding the high side drive circuit region 10 and high withstand voltage isolation region 14.

Figure 3:
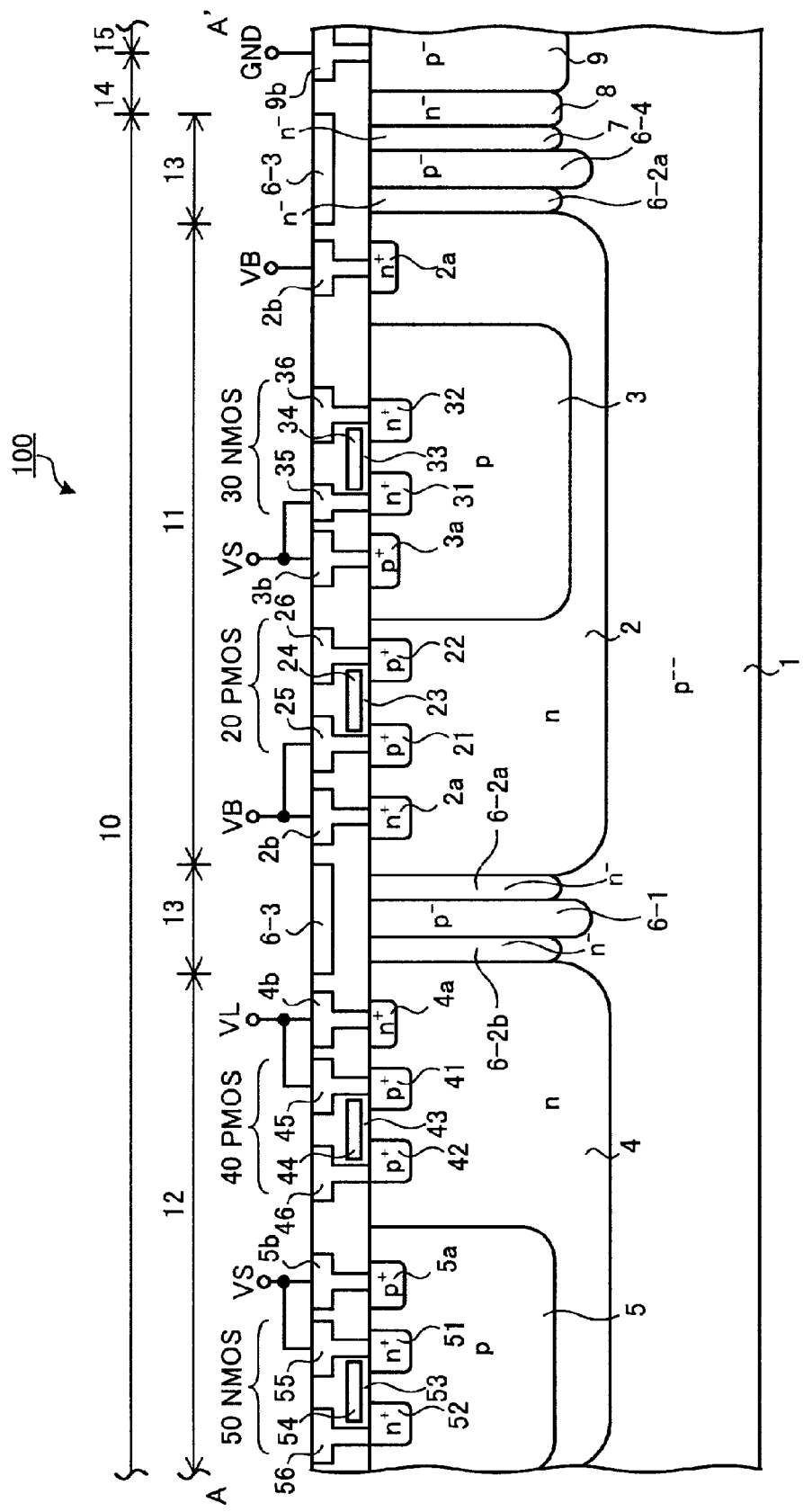
FIG. 3 is a sectional view showing the sectional structure along a cutting line A-A' of FIG. 2.

Next, a description will be given of the sectional structure of the high voltage IC 100 according to Embodiment 1. FIG. 3 is a sectional view showing the sectional structure along a cutting line A-A' of FIG. 2. As shown in FIG. 3, the high voltage IC 100 has an element isolation structure fabricated using a self-isolation IC process in the $p^{--}$-type substrate (semiconductor layer) 1. The $p^{--}$-type substrate 1 is of, for example, the ground potential (fourth potential) GND, lower than the reference potential VS which is the lowest potential of the high side drive circuit 110. A first n-type diffusion region (first semiconductor region) 2 is provided in a surface layer of the front surface of the $p^{--}$-type substrate 1 in the intermediate voltage circuit region 11 of the high side drive circuit region 10. The first n-type diffusion region 2 is connected to a contact electrode 2b via an $n^+$-type high concentration region 2a provided inside the first n-type diffusion region 2.

The contact electrode 2b is connected to the VB terminal of the power supply potential VB (the highest potential of the intermediate voltage circuit unit 111) of the high side drive circuit 110. The $n^+$-type high concentration region 2a and contact electrode 2b are provided in the outer periphery of the intermediate voltage circuit region 11, and enclose the intermediate voltage circuit unit 111 (the intermediate breakdown voltage PMOS 20 and intermediate breakdown voltage NMOS 30, to be described hereafter). The lateral intermediate breakdown voltage PMOS 20 configuring the intermediate voltage circuit unit 111 is formed in the first n-type diffusion region 2. The intermediate breakdown voltage PMOS 20 includes a general element structure formed of a MOS gate (an insulated gate formed of metal-oxide-semiconductor) structure, such as a $p^+$-type source region 21, a $p^+$-type drain region 22, a gate insulating film 23, a gate electrode 24, a source electrode 25, and a drain electrode 26. The source electrode 25 of the intermediate breakdown voltage PMOS 20 is connected to the VB terminal.

Also, a first p-type diffusion region (third semiconductor region) 3 is provided to a comparatively small depth inside the first n-type diffusion region 2. The first p-type diffusion region 3 is connected to a contact electrode 3b via a $p^+$-type high concentration region 3a provided inside the first p-type diffusion region 3. The contact electrode 3b is connected to the VS terminal of the reference potential VS of the high side drive circuit 110. The lateral intermediate breakdown voltage NMOS 30 configuring the intermediate voltage circuit unit 111 is formed in the first p-type diffusion region 3. The intermediate breakdown voltage NMOS 30 includes a general element structure formed of a MOS gate structure, such as an $n^+$-type source region 31, an $n^+$-type drain region 32, a gate insulating film 33, a gate electrode 34, a source electrode 35, and a drain electrode 36. The source electrode 35 of the intermediate breakdown voltage NMOS 30 is connected to the VS terminal.

A second n-type diffusion region (second semiconductor region) 4 is provided, distanced from the first n-type diffusion region 2, in a surface layer of the front surface of the $p^{--}$-type substrate 1 in the low voltage circuit region 12 of the high side drive circuit region 10. The second n-type diffusion region 4 is connected to a contact electrode 4b via an $n^+$-type high concentration region 4a provided inside the second n-type diffusion region 4. The contact electrode 4b is connected to the VL terminal of the highest potential of the low voltage circuit unit 112. A lateral low breakdown voltage PMOS 40 configuring, for example, the comparator 118 of the low voltage circuit unit 112 is formed in the second n-type diffusion region 4. The low breakdown voltage PMOS 40 includes a general element structure formed of a MOS gate structure, such as a $p^+$-type source region 41, a $p^+$-type drain region 42, a gate insulating film 43, a gate electrode 44, a source electrode 45, and a drain electrode 46. The source electrode 45 of the low breakdown voltage PMOS 40 is connected to the VL terminal.

Also, a second p-type diffusion region (fourth semiconductor region) 5 is provided to a comparatively small depth inside the second n-type diffusion region 4. The second p-type diffusion region 5 is connected to a contact electrode 5b via a $p^+$-type high concentration region 5a provided inside the second p-type diffusion region 5. The contact electrode 5b is connected to the VS terminal. A lateral low breakdown voltage NMOS 50 configuring, for example, the comparator 118 of the low voltage circuit unit 112 is formed in the second p-type diffusion region 5. The low breakdown voltage NMOS 50 includes a general element structure formed of a MOS gate structure, such as an $n^+$-type source region 51, an $n^+$-type drain region 52, a gate insulating film 53, a gate electrode 54, a source electrode 55, and a drain electrode 56. The source electrode 55 of the low breakdown voltage NMOS 50 is connected to the VS terminal.

The potential isolation region 13 is configured of $p^-$-type low concentration diffusion regions (first isolation regions) 6-1 and 6-4, $n^-$-type low concentration diffusion regions 6-2a and 6-2b, an $n^-$-type low concentration diffusion region 7, and a field plate 6-3. The $p^-$-type low concentration diffusion region 6-1 is provided in a portion of the $p^{--}$-type substrate 1 sandwiched between the first n-type diffusion region 2 and second n-type diffusion region 4. The $p^-$-type low concentration diffusion region 6-4 is provided so as to enclose the first and second n-type diffusion regions 2 and 4. The $p^-$-type low concentration diffusion regions 6-1 and 6-4 are in contact with the $p^{--}$-type substrate 1 and are of the ground potential GND. It is preferable that the impurity concentration of the $p^-$-type low concentration diffusion regions 6-1 and 6-4 is higher than the impurity concentration of the $p^{--}$-type substrate 1. The reason for this is that the width of the $p^-$-type low concentration diffusion region 6-1 (the distance from the first n-type diffusion region 2 and second n-type diffusion region 4) and the width of the p⁻-type low concentration diffusion region 6-4 can be reduced, and a reduction in size of the high voltage IC 100 can thus be achieved.

For example, when the impurity concentration of the p⁻-type low concentration diffusion region 6-1 is equal to the impurity concentration of the p⁻⁻-type substrate 1, or when the p⁻⁻-type substrate 1 is exposed on the surface without the p⁻-type low concentration diffusion region 6-1 being formed, there is punch-through of a parasitic npn bipolar transistor formed of the first n-type diffusion region 2 (including the n⁻-type low concentration diffusion region 6-2a), the p⁻-type low concentration diffusion region 6-1, and the second n-type diffusion region 4 (including the n⁻-type low concentration diffusion region 6-2b) when the width of the p⁻-type low concentration diffusion region 6-1 is reduced, and there is concern that the withstand voltage between the p⁻-type low concentration diffusion region 6-1 and p⁻⁻-type substrate 1 cannot be maintained. Also, in order that there is no punch-through of the parasitic npn bipolar transistor formed of the first n-type diffusion region 2 (including the n⁻-type low concentration diffusion region 6-2a), the p⁻-type low concentration diffusion region 6-1, and the second n-type diffusion region 4 (including the n⁻-type low concentration diffusion region 6-2b), it is necessary to increase the width of the p⁻-type low concentration diffusion region 6-1, and the size of the high voltage IC 100 thus increases. Therefore, it is preferable that the impurity concentration of the p⁻-type low concentration diffusion region 6-1 is higher than the impurity concentration of the p⁻⁻-type substrate 1.

The n⁻-type low concentration diffusion region 6-2a is provided between the first n-type diffusion region 2 and the p⁻-type low concentration diffusion region 6-1 and p⁻-type low concentration diffusion region 6-4. The n⁻-type low concentration diffusion region 6-2a is formed so as to enclose the first n-type diffusion region 2 and in contact with the first n-type diffusion region 2, and is connected to the VB terminal via the first n-type diffusion region 2. The n⁻-type low concentration diffusion region 6-2b is provided between the second n-type diffusion region 4 and the p⁻-type low concentration diffusion region 6-1 and p⁻-type low concentration diffusion region 6-4. The n⁻-type low concentration diffusion region 6-2b is formed so as to enclose the second n-type diffusion region 4 and in contact with the second n-type diffusion region 4, and is connected to the VL terminal via the second n-type diffusion region 4. The n⁻-type low concentration diffusion regions 6-2a and 6-2b have a function of concentrating an electrical field in the vicinity of the interface with the intermediate voltage circuit region 11 and the vicinity of the interface with the low voltage circuit region 12 when the potential of the VB terminal or VL terminal rises to in the region of several hundred volts, thereby preventing avalanche breakdown from occurring.

Also, the impurity concentration, width, and the like, of the p⁻-type low concentration diffusion region 6-1 are set so that depletion layers spreading from the p-n junctions between the p⁻-type low concentration diffusion region 6-1 and the n⁻-type low concentration diffusion regions 6-2a and 6-2b join, and the p⁻-type low concentration diffusion region 6-1 is depleted, when the potential of the VS terminal rises to in the region of several hundred volts. It is necessary that at least the surface region of the p⁻-type low concentration diffusion region 6-1 is depleted. Also, it is desirable that the whole of the p⁻-type low concentration diffusion region 6-1 is depleted. By the surface region of the p⁻-type low concentration diffusion region 6-1 and one portion of the n⁻-type low concentration diffusion regions 6-2a and 6-2b being depleted, electrical field concentration is restricted, and the withstand voltage between the first and second n-type diffusion regions 2 and 4 and the p⁻⁻-type substrate 1 is maintained. Therefore, the breakdown voltage of the intermediate voltage circuit unit 111 and low voltage circuit unit 112 can be maintained. The n⁻-type low concentration diffusion regions 6-2a and 6-2b have a function of facilitating depletion of the whole of the p⁻-type low concentration diffusion region 6-1. When the whole of the p⁻-type low concentration diffusion region 6-1 is depleted, for example, one portion of the n⁻-type low concentration diffusion regions 6-2a and 6-2b is depleted. As it is sufficient that the p⁻-type low concentration diffusion region 6-1 is provided under the conditions that the p⁻-type low concentration diffusion region 6-1 is depleted and the withstand voltage between the first and second n-type diffusion regions 2 and 4 and the p⁻⁻-type substrate 1 is maintained, the n⁻-type low concentration diffusion regions 6-2a and 6-2b need not be provided. In the same way as for the p⁻-type low concentration diffusion region 6-1, the impurity concentration, width, and the like, of the p⁻-type low concentration diffusion region 6-4 are set so that depletion layers spreading from the p-n junctions between the p⁻-type low concentration diffusion region 6-4 and the n⁻-type low concentration diffusion regions 6-2a and 6-2b and n⁻-type low concentration diffusion region 7 join, and the p⁻-type low concentration diffusion region 6-4 is depleted, when the potential of the VS terminal rises to in the region of several hundred volts.

The field plate 6-3 is provided so as to cover the p⁻-type low concentration diffusion region 6-1 and n⁻-type low concentration diffusion regions 6-2a and 6-2b between the intermediate voltage circuit region 11 and low voltage circuit region 12 across an interlayer dielectric. Also, the field plate 6-3 may be provided so as to cover the n⁻-type low concentration diffusion region 6-2a, p⁻-type low concentration diffusion region 6-4, and n⁻-type low concentration diffusion region 7 between the intermediate voltage circuit region 11 and low voltage circuit region 12 and the high withstand voltage isolation region 14 across an interlayer dielectric. Also, the field plate 6-3 is connected to the VS terminal by wiring omitted from the drawing. The field plate 6-3 has a function of preventing the potential difference between the n⁻-type low concentration diffusion region 6-2a and n⁻-type low concentration diffusion region 6-2b from rising further than at a time of normal operation, and the parasitic npn bipolar transistor formed of the first n-type diffusion region 2 (including the n⁻-type low concentration diffusion region 6-2a), the p⁻-type low concentration diffusion region 6-1, and the second n-type diffusion region 4 (including the n⁻-type low concentration diffusion region 6-2b) from operating, when a surge current (a current caused by a transient abnormal voltage) flows. One terminal of the Zener diode (the Zener diode 117 shown in FIG. 1) is connected to the second n-type diffusion region 4, and the other terminal is connected to the second p-type diffusion region 5. The Zener diode 117 restricts a rise in the potential between the VL terminal and VS terminal when a negative voltage surge enters the VS terminal and a surge current flows from the p⁻⁻-type substrate 1 into the second n-type diffusion region 4.

Although not particularly limiting, the surface impurity concentrations and diffusion depths of the intermediate voltage circuit region 11, low voltage circuit region 12, and each diffusion region of the potential isolation region 13 have the following values. The first n-type diffusion region 2 and second n-type diffusion region 4 may have a surface impurity concentration of $4\times10^{16}/cm^3$, and a diffusion depth of 12 μm. The first p-type diffusion region 3 and second p-type diffusion region 5 may have a surface impurity concentration of $2\times10^{17}/cm^3$, and a diffusion depth of 3 μm. The p⁻-type low concentration diffusion regions 6-1 and 6-4 may have a surface impurity concentration of $4\times10^{15}/cm^3$, and a diffusion depth of 10 μm. The n⁻-type low concentration diffusion regions 6-2a and 6-2b may have a surface impurity concentration of $7\times10^{15}/cm^3$, and a diffusion depth of 10 μm.

The n⁻-type low concentration diffusion region 7 enclosing the periphery of the p⁻-type low concentration diffusion region 6-4 and in contact with the p⁻-type low concentration diffusion region 6-4 is provided in a surface layer of the front surface of the p⁻⁻-type substrate 1. Also, an n⁻-type low concentration diffusion region 8 enclosing the periphery of the n⁻-type low concentration diffusion region 7 and in contact with the n⁻-type low concentration diffusion region 7 is provided in a surface layer of the front surface of the p⁻⁻-type substrate 1. Furthermore, a p⁻-type low concentration diffusion region 9 enclosing the periphery of the n⁻-type low concentration diffusion region 8 and in contact with the n⁻-type low concentration diffusion region 8 is provided in a surface layer of the front surface of the p⁻⁻-type substrate 1. The high withstand voltage isolation region 14 is configured of the n⁻-type low concentration diffusion region 8. A level shifter (not shown) MOSFET is provided in the n⁻-type low concentration diffusion region 8.

The p⁻-type low concentration diffusion region 9 is connected to the GND terminal of the ground potential GND via a contact electrode 9b. The p⁻-type low concentration diffusion region 9 has a function of fixing the p⁻⁻-type substrate 1 to the ground potential GND. Further, when the potential of the high side drive circuit region 10 rises to a high voltage 600V or more higher than that of the low side region 15, the n⁻-type low concentration diffusion region 8 is depleted owing to the p-n junction between the n⁻-type low concentration diffusion region 8 and p⁻-type low concentration diffusion region 9 being reverse biased, and the lateral direction (the direction parallel to the substrate main surface) withstand voltage is maintained.

Next, a description will be given of operations of the high voltage IC 100 according to Embodiment 1, taking as an example a case of driving the first MOSFET 101 on the high side of the power converting bridge circuit. The basic operation of the high voltage IC 100 is the same as that of the existing high voltage IC. Specifically, the high side drive circuit 110, taking the potential of the connection point 105 to which the VS terminal is connected as the reference potential VS, operates at a potential between the reference potential VS and the power supply potential VB, which is the highest potential of the high side drive circuit 110. The control circuit 115, operating with the ground potential GND as a reference, receives an input of a gate control signal, and generates a low side level on/off signal for turning the first MOSFET 101 on and off. The low side level on/off signal is converted into a high side level on/off signal by the level shifter 114, and transmitted to the high side drive circuit 110.

The on/off signal input into the high side drive circuit 110 is input into the gate of the first MOSFET 101 via a NOT circuit and the subsequent gate drive circuit (intermediate voltage circuit unit 111). The first MOSFET 101 is turned on and off in accordance with the on/off signal. The potential of the VS terminal (the reference potential VS) fluctuates between 0V (GND) and several hundred volts (Vdc) while the high voltage IC 100 is operating. When an excessive current flows into the first MOSFET 101 at this time, the overcurrent is detected by the overcurrent detector circuit (low voltage circuit unit 112), and input into the gate of the first MOSFET 101 is stopped. Overcurrent detection by the overcurrent detector circuit is carried out by, for example, current flowing into the first MOSFET 101 being caused to flow into the shunt resistor 119 of the overcurrent detector circuit by the current sensing MOSFET 120 disposed on the exterior of the high voltage IC 100, and the potential difference across the shunt resistor 119 being compared with the reference potential VS by the comparator 118.

Also, the n⁻-type low concentration diffusion region 6-2a is in contact with the first n-type diffusion region 2 and the n⁻-type low concentration diffusion region 6-2b is in contact with the second n-type diffusion region 4, as heretofore described, because of which voltage that is the difference in potential between the VB terminal and VL terminal is applied to the potential isolation region 13 between the intermediate voltage circuit region 11 and low voltage circuit region 12 when the high voltage IC 100 is in an on-state. Meanwhile, as the p⁻-type low concentration diffusion region 6-1 is in contact with the p⁻⁻-type substrate 1, the p⁻-type low concentration diffusion region 6-1 is of the ground potential GND. Therefore, the p-n junction between the p⁻-type low concentration diffusion region 6-1 and n⁻-type low concentration diffusion region 6-2a and the p-n junction between the p⁻-type low concentration diffusion region 6-1 and n⁻-type low concentration diffusion region 6-2b are reverse biased, and no current flows into the p⁻-type low concentration diffusion region 6-1. Therefore, the potential of the low voltage circuit region 12 can be set lower than the potential of the intermediate voltage circuit region 11.

Also, for example, when the first n-type diffusion region 2 and the level shifter drain region are opposed across the p⁻-type low concentration diffusion region 6-4, voltage that is the difference in potential between the VB terminal and the level shifter drain is applied to the potential isolation region 13 between the intermediate voltage circuit region 11 and high withstand voltage isolation region 14. Meanwhile, as the p⁻-type low concentration diffusion region 6-4 is in contact with the p⁻⁻-type substrate 1, the p⁻-type low concentration diffusion region 6-4 is of the ground potential GND. Therefore, the p-n junction between the p⁻-type low concentration diffusion region 6-4 and first n-type diffusion region 2 and the p-n junction between the p⁻-type low concentration diffusion region 6-4 and n⁻-type low concentration diffusion region 7 are reverse biased, and no current flows into the p⁻-type low concentration diffusion region 6-4. Therefore, current leaking from the high side drive circuit 110 can be prevented from flowing into the level shifter provided in the high withstand voltage isolation region 14.

Embodiment 2

Figure 4:
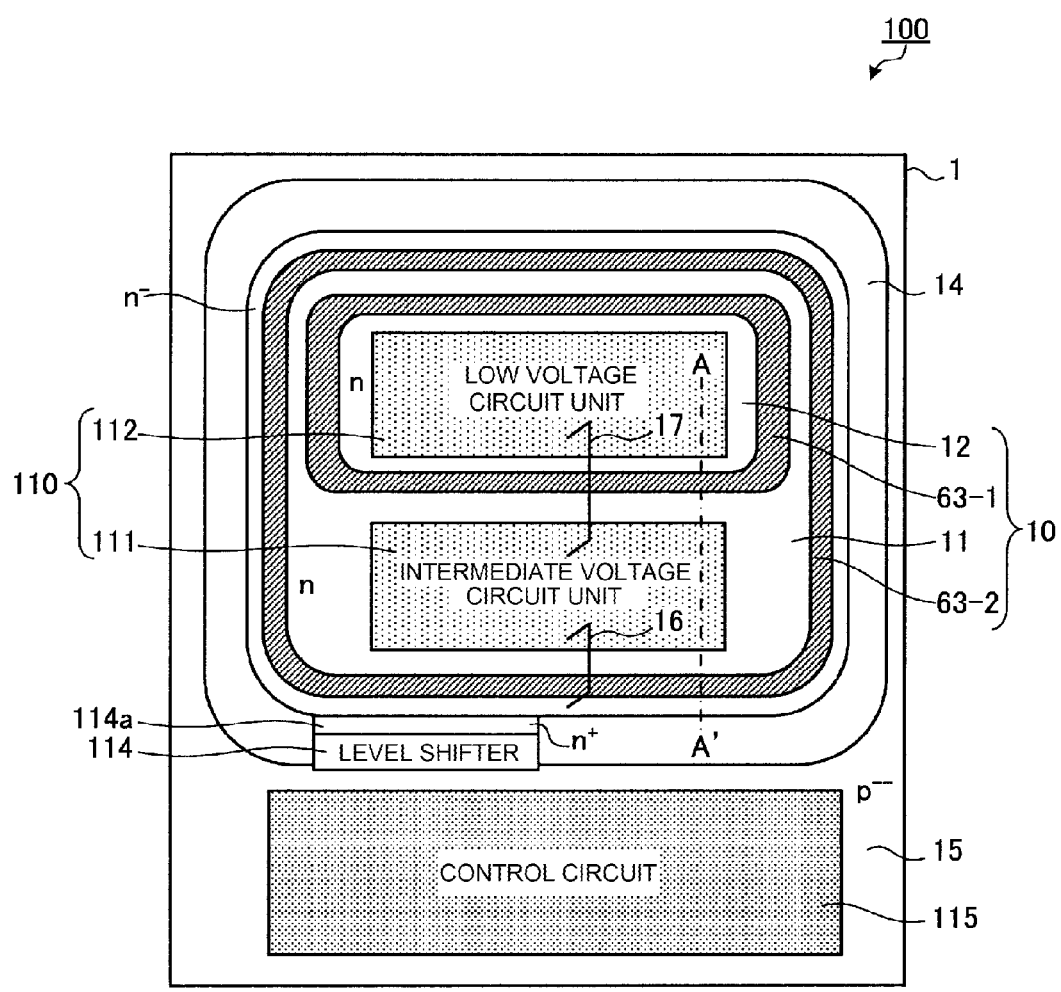
FIG. 4 is a plan view schematically showing the planar structure of a semiconductor device according to Embodiment 2.
Figure 5:
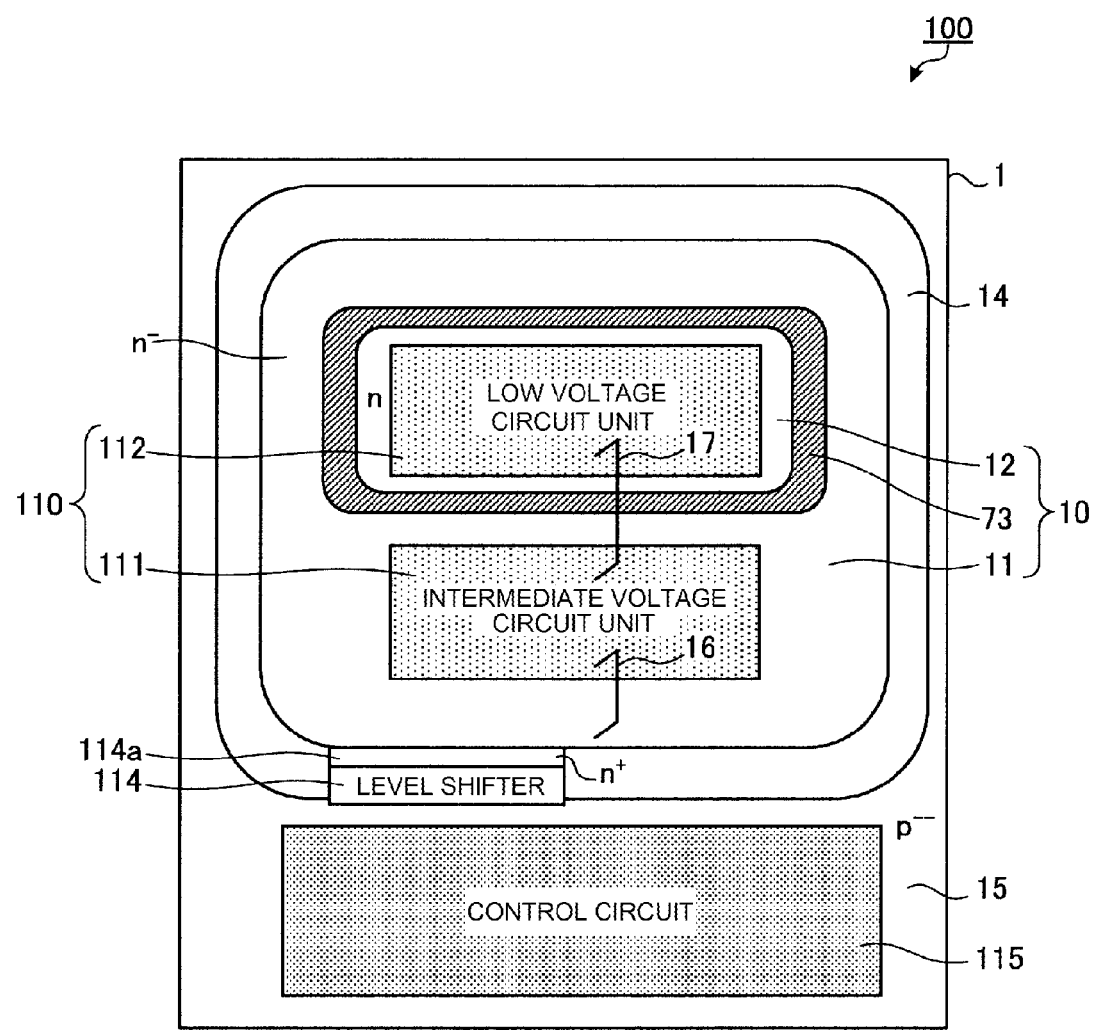
FIG. 5 is a plan view schematically showing another example of the planar structure of the semiconductor device according to Embodiment 2.
Figure 6:
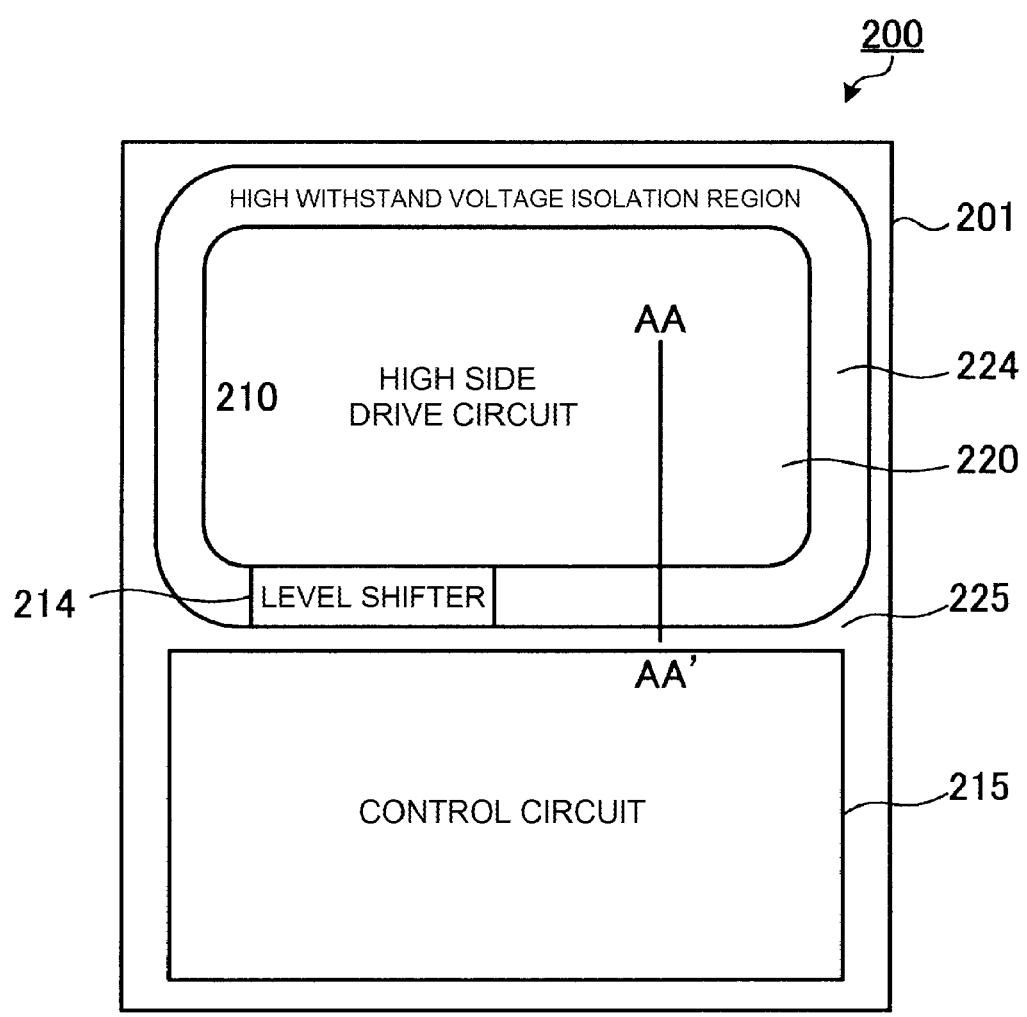
FIG. 6 is a plan view schematically showing the planar structure of an existing high voltage IC.
Figure 7:
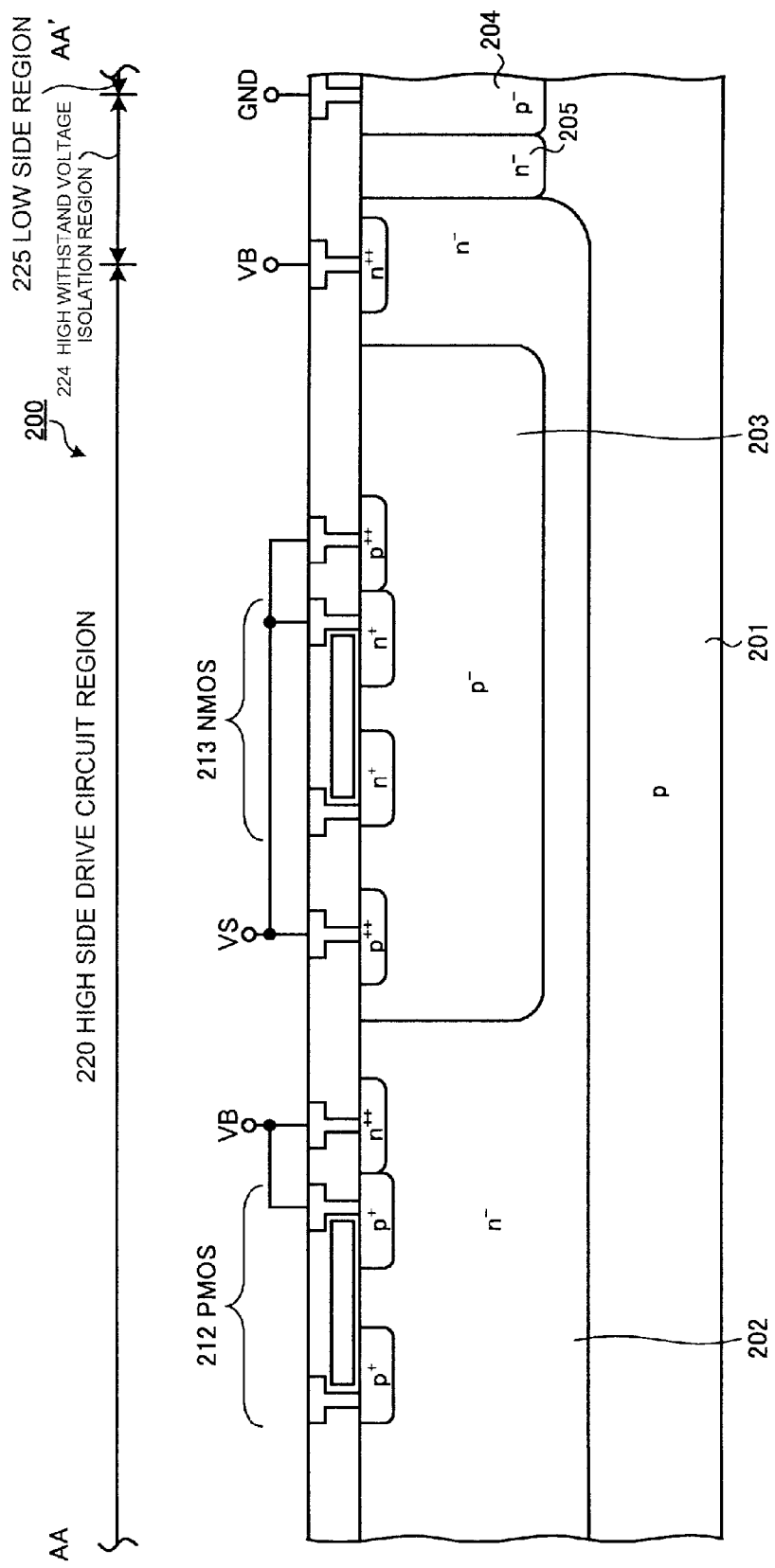
FIG. 7 is a sectional view showing the sectional structure along a cutting line AA-AA' of FIG. 6.
Figure 8:
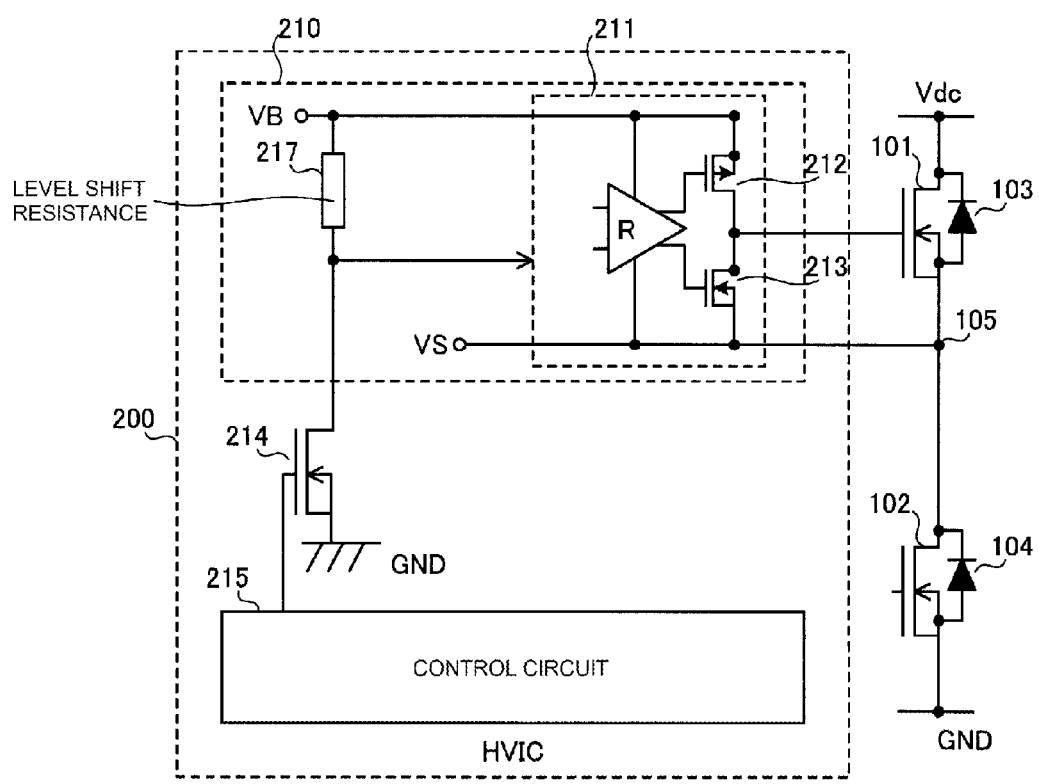
FIG. 8 is a circuit diagram showing an equivalent circuit of the high voltage IC of FIG. 7.

Next, a description will be given of the structure of a semiconductor device according to Embodiment 2. FIG. 4 is a plan view schematically showing the planar structure of a semiconductor device according to Embodiment 2. FIG. 5 is a plan view schematically showing another example of the planar structure of the semiconductor device according to Embodiment 2. The disposition of the potential isolation region in the semiconductor device according to Embodiment 2 differs from that in the semiconductor device according to Embodiment 1. Specifically, as shown in FIG. 4, a ring-form potential isolation region 63-1 enclosing the low voltage circuit region 12 is provided, and furthermore, a ring-form potential isolation region 63-2 enclosing the ring-form potential isolation region 63-1 and intermediate voltage circuit region 11 is provided. The sectional structure along a cutting line A-A' of FIG. 4 is the same as the sectional structure of the semiconductor device according to Embodiment 1 shown in FIG. 3. Also, a configuration wherein only the low voltage circuit region 12 is enclosed by a ring-form potential isolation region 73 may be adopted, as shown in FIG. 5. Configurations other than the potential isolation region of the semiconductor device according to Embodiment 2 are the same as in the semiconductor device according to Embodiment 1.

In this way, the semiconductor device according to Embodiment 2 shown in FIGS. 4 and 5 is such that the intermediate voltage circuit region 11 and low voltage circuit region 12 are electrically isolated by the potential isolation regions 63-1 and 73 disposed between the intermediate voltage circuit region 11 and low voltage circuit region 12. Therefore, in the same way as in Embodiment 1, the potential applied to the low voltage circuit region 12 can be set lower than the potential applied to the intermediate voltage circuit region 11. Also, the semiconductor device according to Embodiment 2 shown in FIG. 4 is such that the intermediate voltage circuit region 11 and the drain 114a of the level shifter 114 disposed in the high withstand voltage isolation region 14 are electrically isolated by the potential isolation region 63-2 disposed between the intermediate voltage circuit region 11 and high withstand voltage isolation region 14. Therefore, in the same way as in Embodiment 1, leakage current of the intermediate voltage circuit region 11 can be prevented from flowing into the drain 114a of the level shifter 114.

As heretofore described, according to the embodiments, by a p⁻-type low concentration diffusion region of ground potential being provided between a first n-type diffusion region connected to a VB terminal and a second n-type diffusion region connected to a VL terminal of a potential lower than the potential of the VB terminal, the first n-type diffusion region and second n-type diffusion region can be electrically isolated when a high voltage IC is in an on-state. Therefore, an intermediate breakdown voltage MOSFET can be disposed in the first n-type diffusion region, and a low breakdown voltage MOSFET with an on-state resistance lower than that of the intermediate breakdown voltage MOSFET can be disposed in the second n-type diffusion region. Therefore, electrical characteristics can be improved in comparison with an existing high side drive circuit configured of only intermediate breakdown voltage MOSFETs, and an increase in performance can thus be achieved. Also, according to the embodiments, by the high side drive circuit being configured of an intermediate breakdown voltage MOSFET and a low breakdown voltage MOSFET, the chip area can be reduced in comparison with an existing high side drive circuit configured of only intermediate breakdown voltage MOSFETs, and a reduction in size can thus be achieved.

Heretofore, the invention has been described taking as an example a high side drive circuit that drives a first MOSFET on the high side of a bridge circuit but, the heretofore described embodiments not being limiting, the invention is applicable to circuits of various configurations wherein a multiple of elements of differing power supply potentials are provided in the same substrate. Also, in the heretofore described embodiments, the configuration is such that only a PMOS and NMOS configuring a gate drive circuit are provided in first and second n-type diffusion regions, but other components configuring the high side drive circuit, or components of a circuit other than the high side drive circuit, may also be provided in the first and second n-type diffusion regions. Also, the heretofore described embodiments are also established in the same way when the conductivity types (n-type and p-type) of the semiconductor layers or semiconductor regions are reversed.

INDUSTRIAL APPLICABILITY

As heretofore described, the semiconductor device according to the invention is useful in a power semiconductor device used in a power conversion device such as an inverter or in a power supply device, or the like, of various kinds of industrial machine or the like.

REFERENCE SIGNS LIST 1 p⁻⁻-type substrate
2 First n-type diffusion region
2a, 4a n⁺-type high concentration region
2b, 3b, 4b, 5b, 9b Contact electrode
3 First p-type diffusion region
3a, 5a, p⁺-type high concentration region
4 Second n-type diffusion region
5 Second p-type diffusion region
7, 8 n⁻-type low concentration diffusion region
9 p⁻-type low concentration diffusion region
10 High side drive circuit region
11 Intermediate voltage circuit region
12 Low voltage circuit region
13 Potential isolation region
14 High withstand voltage isolation region
15 Low side region
20 Intermediate breakdown voltage PMOS
21, 41 p⁺-type source region
22, 42 p⁺-type drain region
23, 33, 43, 53 Gate insulating film
24, 34, 44, 54 Gate electrode
25, 35, 45, 55 Source electrode
26, 36, 46, 56 Drain electrode
30 Intermediate breakdown voltage NMOS
31, 51 n⁺-type source region
32, 52 n⁺-type drain region
40 Low breakdown voltage PMOS
50 Low breakdown voltage NMOS
100 High voltage IC
101 First MOSFET
102 Second MOSFET
103, 104 FWD
105 Connection point of first MOSFET and second MOSFET
110 High side drive circuit
111 Intermediate voltage circuit unit
112 Low voltage circuit unit
113 Level shift resistor
114 Level shifter
114a Level shifter drain
115 Control circuit
117 Zener diode
118 Comparator
119 Shunt resistor
120 Current sensing MOSFET
GND Ground potential
VB High side drive circuit power supply potential
VS High side drive circuit reference potential

What is claimed is:

1. A semiconductor device, comprising:
a semiconductor layer that is a first-conductivity-type semiconductor layer;
a first semiconductor region that is a second-conductivity-type first semiconductor region, selectively provided in a surface layer of the first-conductivity-type semiconductor layer and connected to a first potential;
a second semiconductor region that is a second-conductivity-type second semiconductor region, selectively provided in a surface layer of the semiconductor layer and connected to a second potential which is lower than that of the first potential;
a third semiconductor region that is a first-conductivity-type third semiconductor region, selectively provided inside the first semiconductor region and connected to a third potential which is lower than that of the second potential;
a fourth semiconductor region that is a first-conductivity-type fourth semiconductor region, selectively provided inside the second semiconductor region and connected to the third potential;
a plurality of a first element provided in each of the first semiconductor region, the second semiconductor region, the third semiconductor region, and the fourth semiconductor region, and operating with the third potential as a reference potential;
a first isolation region that is a first-conductivity-type first isolation region, that is provided between the first semiconductor region and the second semiconductor region and in contact with the first semiconductor region and the second semiconductor region, that is electrically connected to the semiconductor layer, which is connected to a fourth potential which is lower than the first potential and the second potential; and
a second isolation region that is a second conductivity-type-second isolation region which encloses the periphery of the first semiconductor region and the second semiconductor region, which maintains a withstand voltage of the first semiconductor region and the second semiconductor region, and which has an impurity concentration which is lower than that of the first semiconductor region and the second semiconductor region.

2. The semiconductor device according to claim 1, wherein the first isolation region is provided at least between a portion in which the first elements of the first semiconductor region and the third semiconductor region are provided and a portion in which the first elements of the second semiconductor region and the fourth semiconductor region are provided.

3. The semiconductor device according to claim 1, wherein the first isolation region is provided so as to enclose the periphery of the second semiconductor region.

4. The semiconductor device according to claim 1, wherein the first semiconductor region includes a first region in which the first element is formed and a second region, provided between the first region and the first isolation region, and having an impurity concentration which is lower than that of the first region.

5. The semiconductor device according to claim 1, further comprising:
a second element provided in the second isolation region, wherein the first isolation region is provided at least between the first semiconductor region and a portion in which the second element of the second isolation region is provided.

6. The semiconductor device according to claim 1, wherein the first elements provided in the second semiconductor region and the fourth semiconductor region have a breakdown voltage which is lower than a difference between the first potential and third potential.

7. The semiconductor device according to claim 1, wherein the first isolation region has a surface that includes an oxide film, and wherein the semiconductor device further comprises a conductive body provided across then oxide film on the surface of the first isolation region and connected to the third potential.

8. The semiconductor device according to claim 1, further comprising a third element that has two terminals, one terminal of which is connected to the second semiconductor region and another terminal of which is connected to the fourth semiconductor region,
wherein a withstand voltage between the two terminals of the third element is greater than a difference between the second potential and the third potential and smaller than a difference between the first potential and third potential.

9. The semiconductor device according to claim 1, wherein a gate drive circuit that drives an external transistor is configured of a plurality of the first element.

10. The semiconductor device according to claim 9, wherein the external transistor is connected between a positive electrode side and a negative electrode side of a power supply, wherein a low potential side terminal of the external transistor has a potential that is the third potential, and wherein the third potential fluctuates between the positive electrode side and negative electrode side of the power supply.

11. The semiconductor device according to claim 1, wherein, when the third potential is higher than the fourth potential, depletion layers spread from the p-n junction between the first isolation region and the first semiconductor region and second semiconductor region.

12. The semiconductor device according to claim 2, wherein, when the third potential is higher than the fourth potential, depletion layers spread from the p-n junction between the first isolation region and the first semiconductor region and second semiconductor region.

13. The semiconductor device according to claim 3, wherein, when the third potential is higher than the fourth potential, depletion layers spread from the p-n junction between the first isolation region and the first semiconductor region and second semiconductor region.

14. The semiconductor device according to claim 4, wherein, when the third potential is higher than the fourth potential, depletion layers spread from the p-n junction between the first isolation region and the first semiconductor region and second semiconductor region.

15. The semiconductor device according to claim 5, wherein, when the third potential is higher than the fourth potential, depletion layers spread from the p-n junction between the first isolation region and the first semiconductor region and second semiconductor region.

16. The semiconductor device according to claim 6, wherein, when the third potential is higher than the fourth potential, depletion layers spread from the p-n junction between the first isolation region and the first semiconductor region and second semiconductor region.

17. The semiconductor device according to claim 7, wherein, when the third potential is higher than the fourth potential, depletion layers spread from the p-n junction between the first isolation region and the first semiconductor region and second semiconductor region.

18. The semiconductor device according to claim 8, wherein, when the third potential is higher than the fourth potential, depletion layers spread from the p-n junction between the first isolation region and the first semiconductor region and second semiconductor region.

19. The semiconductor device according to claim 9, wherein, when the third potential is higher than the fourth potential, depletion layers spread from the p-n junction between the first isolation region and the first semiconductor region and second semiconductor region.

20. The semiconductor device according to claim 10, wherein, when the third potential is higher than the fourth potential, depletion layers spread from the p-n junction between the first isolation region and the first semiconductor region and second semiconductor region.

* * * * *